United States Patent
Son et al.

(10) Patent No.: US 6,737,590 B2
(45) Date of Patent: May 18, 2004

(54) TAPE CIRCUIT BOARD AND SEMICONDUCTOR CHIP PACKAGE INCLUDING THE SAME

(75) Inventors: Dae-Woo Son, Chungcheongam-do (KR); Hyoung-Chan Chang, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/059,661

(22) Filed: Jan. 28, 2002

(65) Prior Publication Data

US 2002/0104684 A1 Aug. 8, 2002

(30) Foreign Application Priority Data

Feb. 7, 2001 (KR) .......................................... 2001-5868

(51) Int. Cl.[7] ............................ H01R 12/04; H05K 1/11
(52) U.S. Cl. ...................... 174/267; 174/263; 257/779
(58) Field of Search ................... 174/254–260, 174/262–267, 200–207; 361/760–762, 792–795, 776–779, 749, 803, 778–780; 257/723–724, 712–713, 668, 732, 780; 438/106, 113, 117–118, 612–613

(56) References Cited

U.S. PATENT DOCUMENTS

| | | | | |
|---|---|---|---|---|
| 5,801,449 A | * | 9/1998 | Dehaine et al. | 257/779 |
| 5,956,606 A | * | 9/1999 | Burnette | 438/612 |
| 5,986,348 A | * | 11/1999 | Fukano | 257/780 |
| 6,011,694 A | * | 1/2000 | Hirakawa | 174/16.3 |
| 6,046,910 A | * | 4/2000 | Ghaem et al. | 174/260 |
| 6,097,610 A | * | 8/2000 | Hashimoto | 174/255 |
| 6,114,754 A | * | 9/2000 | Kata | 257/668 |
| 6,150,194 A | * | 11/2000 | Sakaguchi et al. | 438/118 |
| 6,362,436 B1 | * | 3/2002 | Kimbara et al. | 174/256 |
| 6,509,643 B2 | * | 1/2003 | Ohtaka et al. | 257/712 |

\* cited by examiner

*Primary Examiner*—David A. Zarneke
*Assistant Examiner*—Tuan Dinh
(74) *Attorney, Agent, or Firm*—Marger Johnson & McCollom, P.C.

(57) ABSTRACT

A tape circuit board for manufacturing a fine pitch semiconductor chip package, a method for manufacturing the tape circuit board, and a semiconductor chip package using the tape circuit board are provided. The tape circuit board includes an insulating base film having a first surface and a second surface. An adhesive layer is formed on the first surface of the base film. Further, wiring patterns are formed on the adhesive layer. Conductive bumps extend through the base film and the adhesive layer and are connected to the wiring patterns. The conductive bumps extend above the second surface of the base film.

4 Claims, 7 Drawing Sheets

FIG. 13

TAPE CIRCUIT BOARD AND SEMICONDUCTOR CHIP PACKAGE INCLUDING THE SAME

This application relies for priority upon Korean Patent Application No. 2001-5868, filed on Feb. 7, 2001, the contents of which are herein incorporated by reference in their entirety.

BACKGROUND OF THE INVENTION

1. Field of the Invention

The present invention relates to semiconductor packaging technology and, more particularly, to a semiconductor chip package having a tape circuit board.

2. Description of the Related Arts

Recently, in order to meet the pressing demand for miniaturization, thinner profiles, higher integrity, higher speeds, and high pint counts in semiconductor packages, tape circuit boards have become increasingly popular. The tape circuit board includes an insulating thin base film made of a polyimide resin, wiring patterns on the base film, and connection leads connected to the wiring patterns. The tape circuit board employs a so-called "Tape Automated Bonding (TAB)" technique, where bumps on a semiconductor die are gang-bonded to the leads of the tape circuit board. Thus, the tape circuit board is referred to as a "TAB tape". As one example of a semiconductor chip package using the tape circuit board, a Tape Carrier Package (TCP) is explained below.

Figure 1:
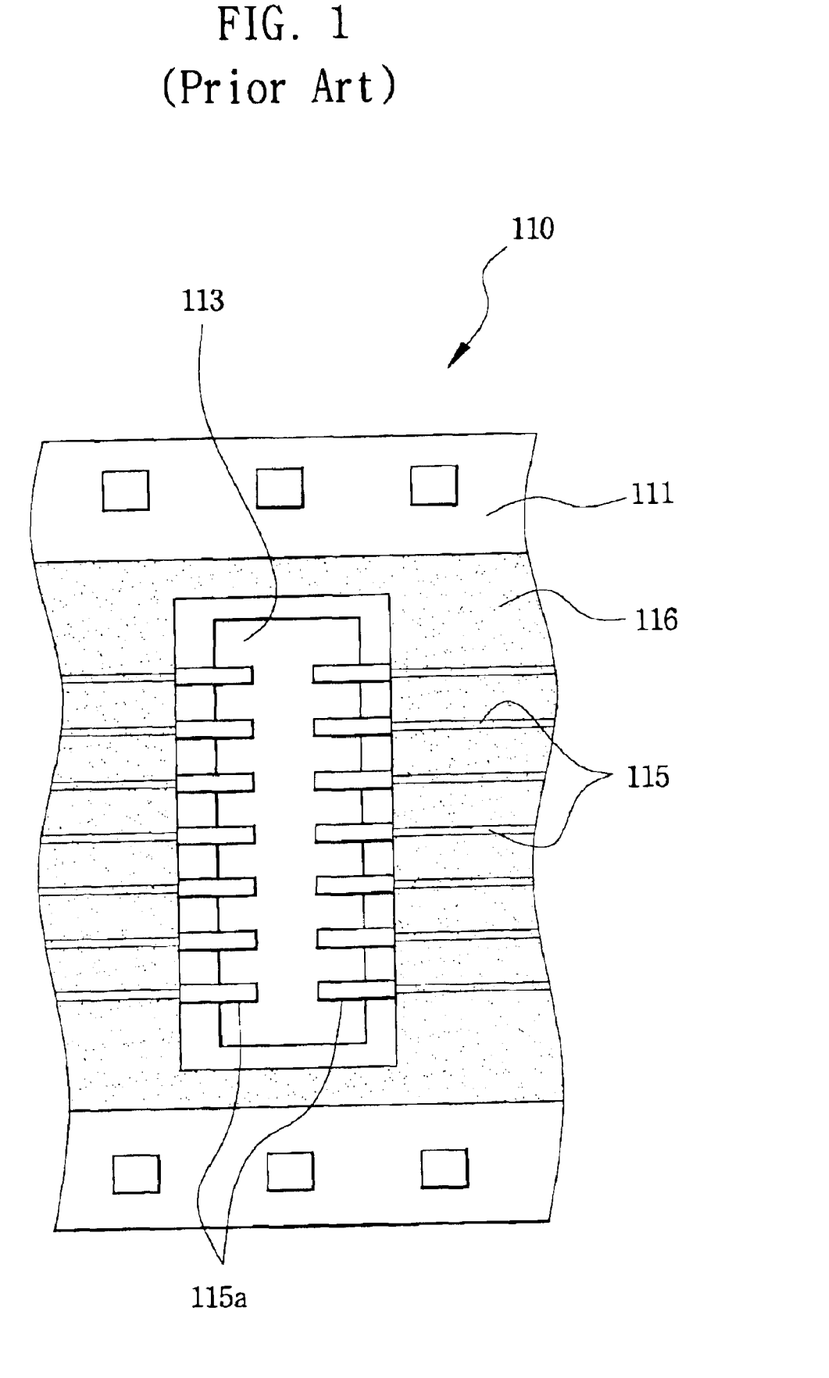
FIG. 1 is a plan view of a conventional tape circuit board.
Figure 2:
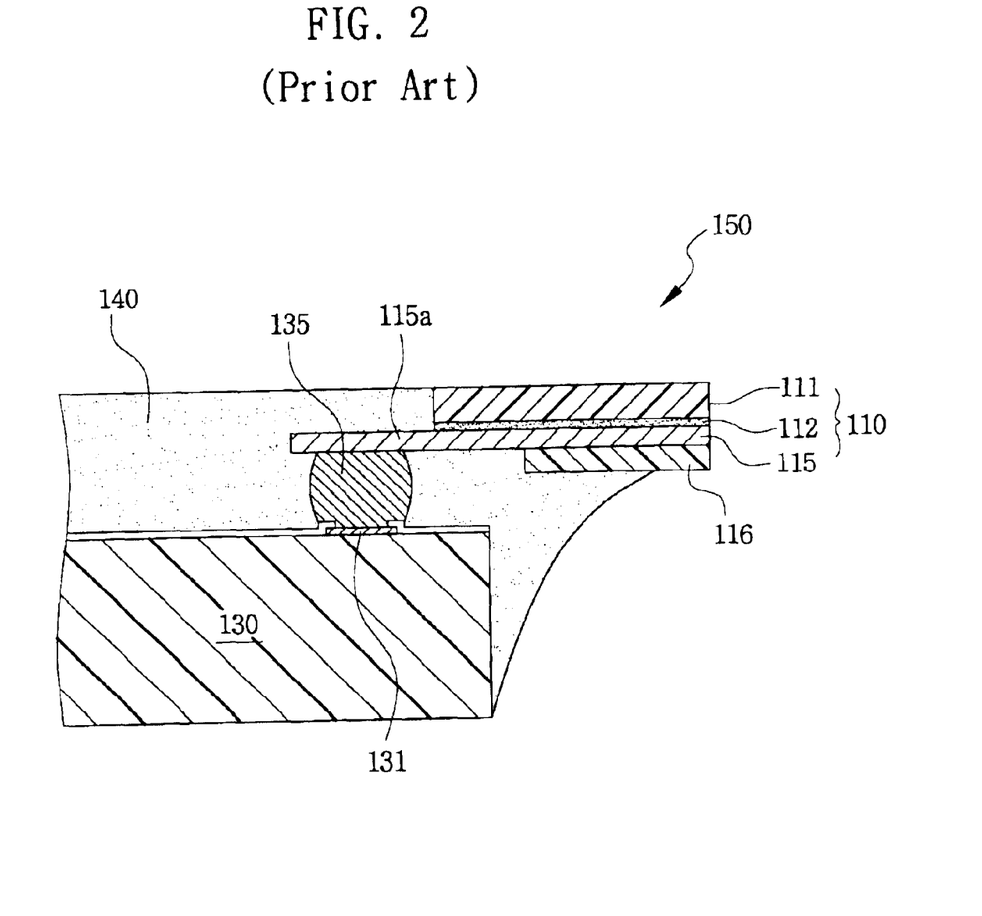
FIG. 2 is a cross-sectional view of a conventional semiconductor chip package, i.e., a conventional tape carrier package.

FIG. 1 is a plan view of a conventional tape circuit board and FIG. 2 is a cross-sectional view of a conventional tape carrier package.

Referring to FIG. 1 and FIG. 2, a conventional tape circuit board 110 includes an insulating base film 111 made of polyimide resin, an adhesive layer 112 formed on the base film 111, and wiring patterns 115 formed on the adhesive layer 112. The wiring patterns 115 are typically formed by laminating a Cu film and selectively photo-etching the Cu film. The wiring patterns 115 can be covered with a protection layer 116 made of solder resist, and leads 115a connected to the wiring patterns 115 are exposed from the protection layer 116 and extend across a window 113.

Again referring to FIG. 2, a conventional carrier package 150 includes the tape circuit board 110 of FIG. 1 and a semiconductor chip 130 mounted on the tape circuit board 110. The semiconductor chip 130 has chip bumps 135 and is flip-chip bonded to the tape circuit board 110 using the chip bumps 135. The chip bumps 135 on electrode pads 131 of the semiconductor chip 130 are bonded to the leads 115a of the tape circuit board 110. The electrical bonding portion between the semiconductor chip 130 and the tape circuit board 110, the active and the side surfaces of the semiconductor chip 130, and the exposed leads 115a are encapsulated with a potting resin, thereby forming a molding portion 140.

Since this conventional tape carrier package uses a tape circuit board on which fine wiring patterns are formed, the distance and pitch between neighboring leads can be minimized, thus maximizing lead density. Further, this tape carrier package can employ semiconductor chips with a large number of chip pads and fine pitch or large-sized semiconductor chips. Therefore, the tape carrier package using the tape circuit board achieves high-integrated and multi-functional semiconductor device.

However, the conventional tape carrier package with the tape circuit board has several problems in meeting the demand for fine pitch of the chip pads of the semiconductor chip. That is, the tape carrier package is limited in its ability to decrease the pitch of the leads and to precisely align the chip bumps to the leads. Furthermore, the leads are exposed to the external environment before the molding step, which causes deformation or damage to the leads during the assembly process. Therefore, it is not easy to apply the tape circuit board to a tape carrier package with fine pitch, particularly 40 mm pitch.

In order to prevent the above-described problems, a Kapton-type transparent tape circuit board without a window for mounting semiconductor chips has been introduced. Similarly, as a package with fine pitch, a Chip On Film (COF) package is now being developed. The COF package has an excellent bending force and a good flexibility, compared to the conventional tape carrier package, is of high quality, thus meeting the demand of Active Matrix LCD devices (AMLCD). However, because this COF package has a two-layered structure, dissociation between the base film and a Cu layer occurs during High Temperature Storage (HTS) test, and since the film needs to be unloaded, mass production is difficult. Therefore, if a tape circuit board that could be applied to the fine pitch semiconductor chip package were developed, mass production can be accomplished.

SUMMARY OF THE INVENTION

Accordingly, an object of the present invention is to provide a tape circuit board for application to a fine pitch semiconductor chip package, a method for manufacturing the tape circuit board, and a semiconductor chip package using the tape circuit board.

In order to achieve the foregoing and other objects, a tape circuit board includes an insulating base film having a first surface and a second surface. An adhesive layer is formed on the first surface of the base film. Further, wiring patterns are formed on the adhesive layer. Conductive bumps extend through the base film and the adhesive layer and are connected to the wiring patterns. The conductive bumps extend above the second surface of the base film.

Preferably, the bumps are disposed in plural columns, and bumps in one column are not aligned with the bumps in adjoining columns. A window for mounting a semiconductor chip is formed through the tape circuit board, and the bumps are formed on the tape circuit board around the window. The bumps are formed on two sides or four sides around the window.

According to another embodiment of the present invention, a method of manufacturing tape circuit boards is provided. According to one embodiment of the present invention, the method comprises: (a) preparing an insulating base film having a first and a second surface, the first surface on which an adhesive layer is formed; (b) forming bump holes penetrating the adhesive layer and the base film, and a window for mounting a chip; (c) forming wiring patterns on the adhesive layer; (d) coating the wiring patterns with a protection layer; (e) forming a photoresist layer on the second layer of the base film so that the bump holes are open; (f) forming bumps connected to the wiring patterns by filling the bump holes using the photoresist layer as a mask; and (g) removing the photoresist layer.

Preferably, in step (f), the bumps extend above the second surface of the base film. After step (g), the manufacturing method may comprise polishing the bumps or applying a cover film on the second surface of the base film.

In still another aspect of the present invention, a semiconductor chip package comprises: a tape circuit board including a base film having a first and a second surface, the first surface on which an adhesive layer is formed; wiring patterns formed on the first surface of the base film; and bumps passing through the base film and the adhesive layer, connected to the wiring patterns, and extending above the second surface of the base film; a semiconductor chip having a plurality of electrode pads and chip bumps formed on the electrode pads, wherein the chip bumps are bonded to the bumps of the tape circuit board; and a molding portion for molding a bonding portion between the tape circuit board and the semiconductor chip, and the active and the side surfaces of the semiconductor chip.

Preferably, the bumps of the tape circuit board and the chip bumps of the semiconductor chip are made of the same material and a protection layer covers the wiring patterns.

BRIEF DESCRIPTION OF THE DRAWINGS

These and other objects, features and advantages of the present invention will be readily understood with reference to the following detailed description provided in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 3:
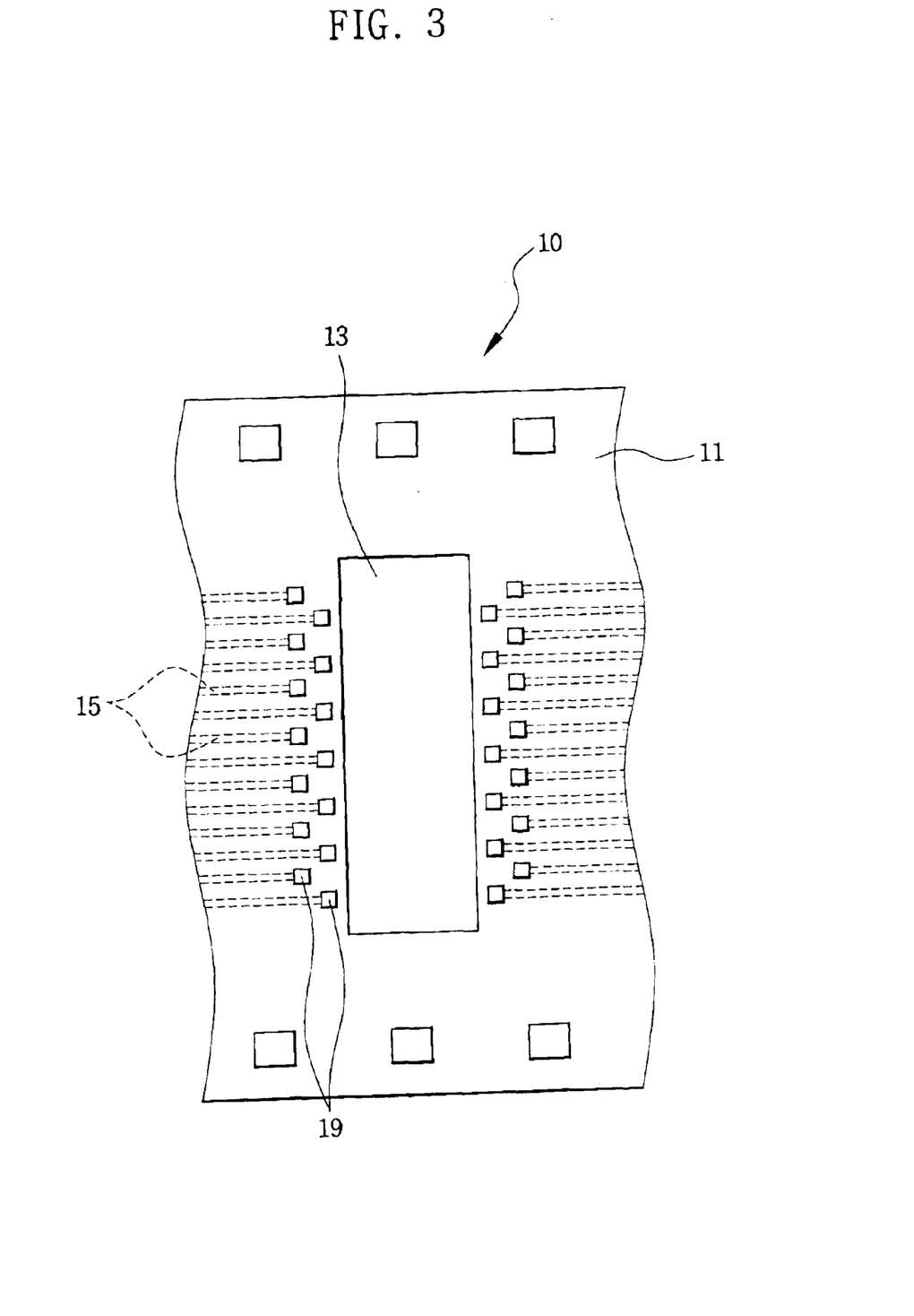
FIG. 3 is a plan view of a tape circuit board in accordance with a preferred embodiment of the present invention.

FIG. 3 is a plan view of a tape circuit board in accordance with an embodiment of the present invention, and FIGS. 4 through 12 are cross-sectional views showing various stages of a manufacturing method for the tape circuit board in accordance with an embodiment of the present invention.

Figure 11:
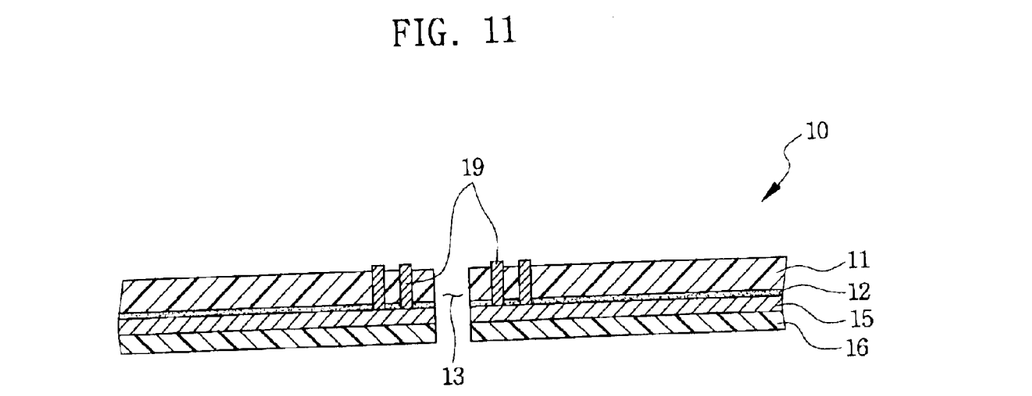

With reference to FIG. 3 and FIG. 11, a tape circuit board 10 for tape carrier package comprises an insulating base film 11 having a first and a second surface, an adhesive layer 12 formed on the first surface of the base film 11, wiring patterns 15 on the adhesive layer 12, and conductive bumps 19 extending above the second surface of the base film 11 and electrically connected to the wiring patterns 15. A window 13 is formed through the base film 11, and the bumps 19 are formed on both sides of the window 13, two columns per each side. Also, the bumps 19 can be formed on four sides of the window 13 depending on applications. In order to maintain a predetermined pitch (vertical spacing) between the neighboring bumps 19, the columns of the bumps 19 on either side of the window 13 are arranged in a zigzag manner, as shown.

The wiring patterns 15 formed on the first surface of the base film 11 are coated with a protection layer 16 that overlies the adhesive layer 12 so that the wiring patterns 15 are not exposed. The protection layer 16 is preferably made of solder resist.

Thus, in the tape circuit board of the present invention, the wiring patterns are coated with the protection layer 16 and are thus not exposed to the external environment as discussed. Also, the tape circuit board uses the bumps as the electrical bonding means between the semiconductor chip and the tape circuit board. The conventional tape circuit board comprises leads exposed to the window and electrically connected to the wiring patterns. However, the tape circuit board of the present invention uses bumps connected to the wiring patterns, thereby preventing problems due to exposed leads, such as lead deformation or lead damage. Further, the bumps of the present invention have many variations in alignment configuration across multiple columns, increasing the pitch and meeting the demand for a multiple pin structure. Moreover, the bumps reduce signal transmission error due to electrical interference. The tape circuit board of the present invention can be manufactured by the process described below in accordance with an embodiment of the present invention.

Figure 4:
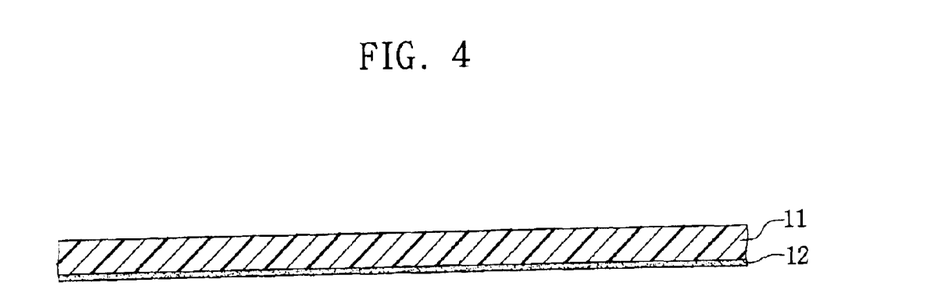
FIGS. 4 through 12 are cross-sectional views showing each step of a manufacturing method for the tape circuit board of the present invention.

As shown in FIG. 4, the insulating base film 11 is prepared. The base film 11 comprises a first surface on which the adhesive layer 12 is formed and a second surface opposite the first surface. The insulating base film 11 is preferably made of a polyimide resin. However, a person skilled in the art will appreciate that other suitable insulating material can be used to form the insulating base film 11.

Figure 5:
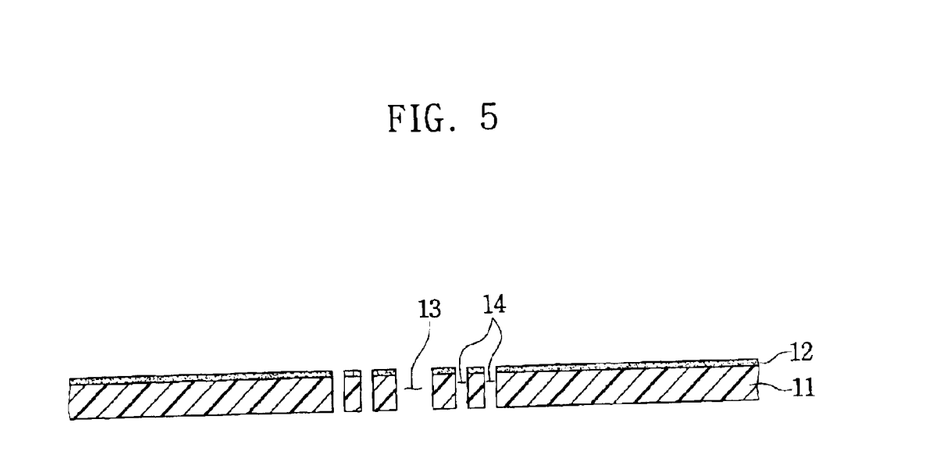

As shown in FIG. 5, bump holes 14 and the window 13 penetrating the adhesive layer 12 and the base film 11 are formed. The window 13 for mounting the semiconductor chip is formed in the center of the adhesive layer 12 and the base film 11, and the bump holes 14 in two columns are formed on both sides along the window 13.

Figure 6:
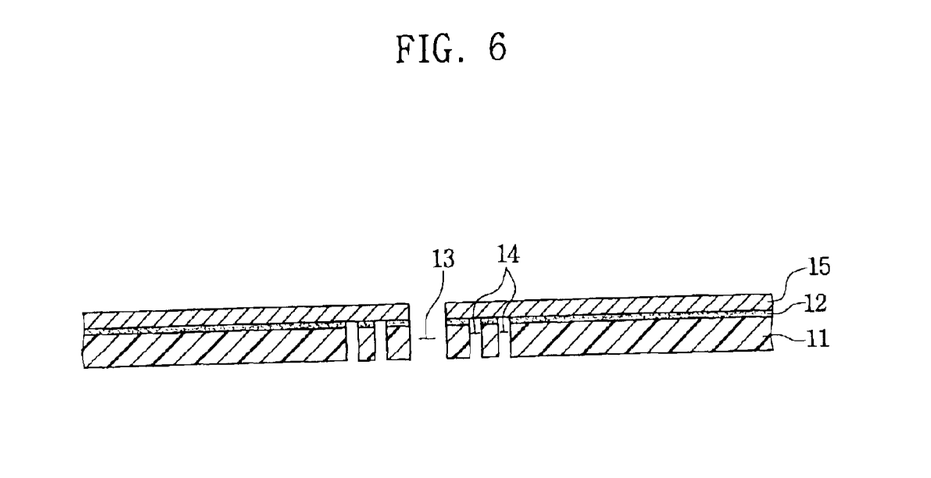

Then, as shown in FIG. 6, the wiring patterns 15 defining predefined circuits are formed on the adhesive layer 12. A Cu foil is laminated on the adhesive layer 12 and selectively etched by a photo-etching method, thereby forming the wiring patterns 15. At this time, one terminal of each bump hole 14 is covered and blocked by the wiring patterns 15. One skilled in the art will appreciate that other suitable wiring patterns can be used instead of one made of Cu.

Figure 7:
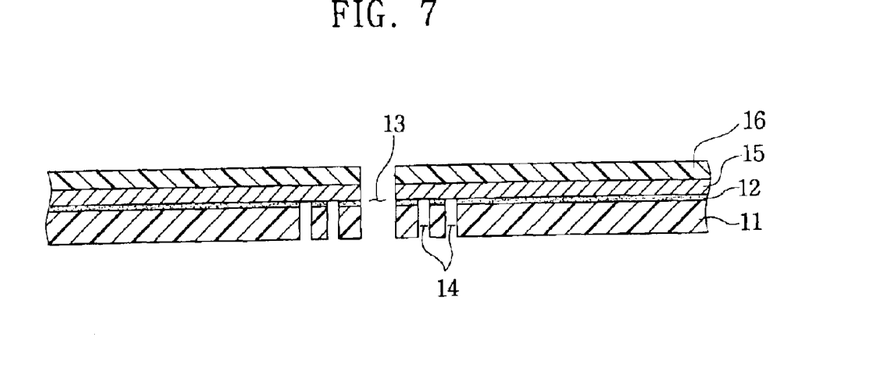

As shown in FIG. 7, the protection layer 16 is formed on the wiring patterns 15. In order to protect the wiring patterns 15 from the external environment, the wiring patterns 15 overlying the adhesive layer 12 is coated with photoresist, i.e. the protection layer 16. Other suitable protective materials can be coated on the wiring patterns 15 instead of photoresist.

Figure 8:
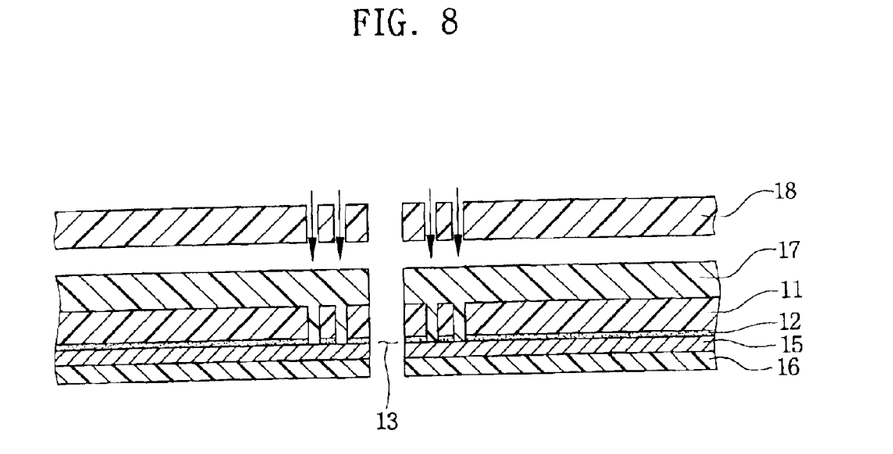

Referring to FIG. 8, a photoresist layer 17 is formed on the second surface of the base film 11 including the bump holes 14.

Figure 9:
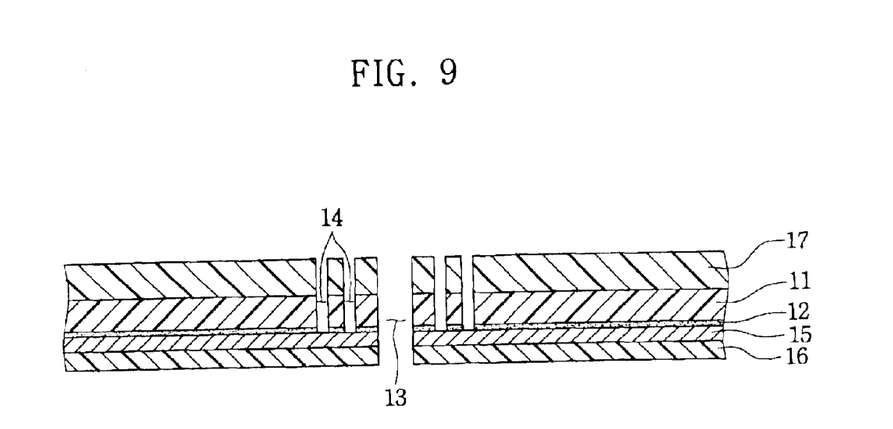

Now referring to FIG. 9, the bump holes 14 are then opened by etching the photoresist layer 17 with a photo mask 18.

Figure 10:
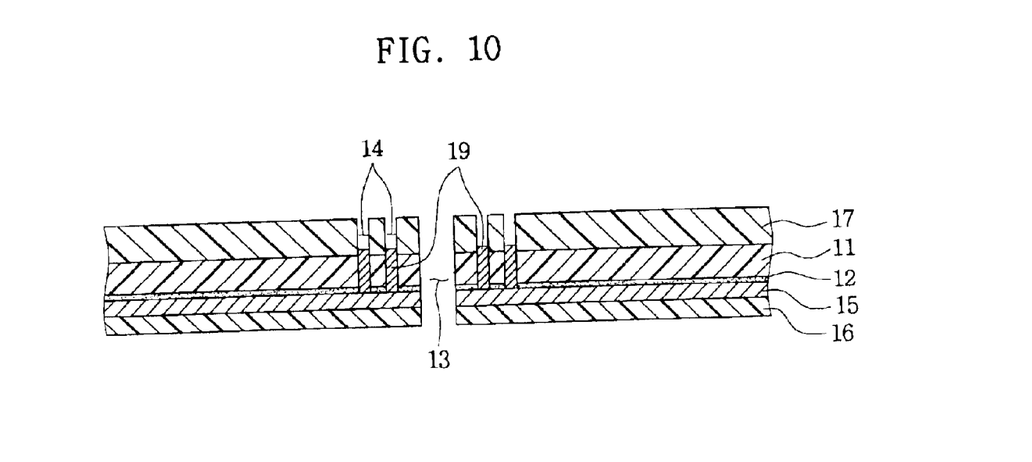

Turning to FIG. 10, using the photoresist layer 17 as a mask, the bump holes 14 are filled with a conductive metal, thereby forming the bumps 19 connected to the wiring patterns 15. The bumps 19 extend above the second surface of the base film 11 and preferably made of Au, Cu, solder, and so on.

Figure 12:
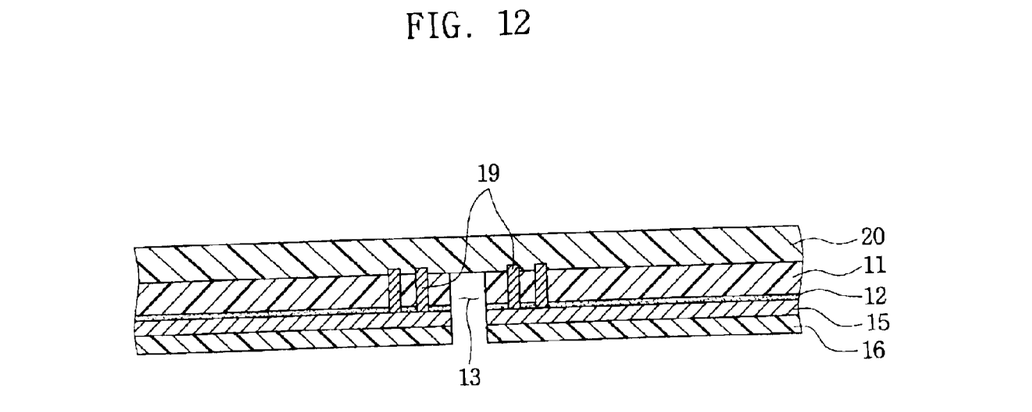

As shown in FIG. 11, the photoresist layer (17 in FIG. 10) is subsequently removed using an etchant. Then, the second surface of the base film 11 is polished. As shown in FIG. 12, the second surface of the base film 11 is covered with a cover film 20 so as to protect the base film during handling.

A semiconductor chip package using the above-described tape circuit board is described below.

Figure 13:
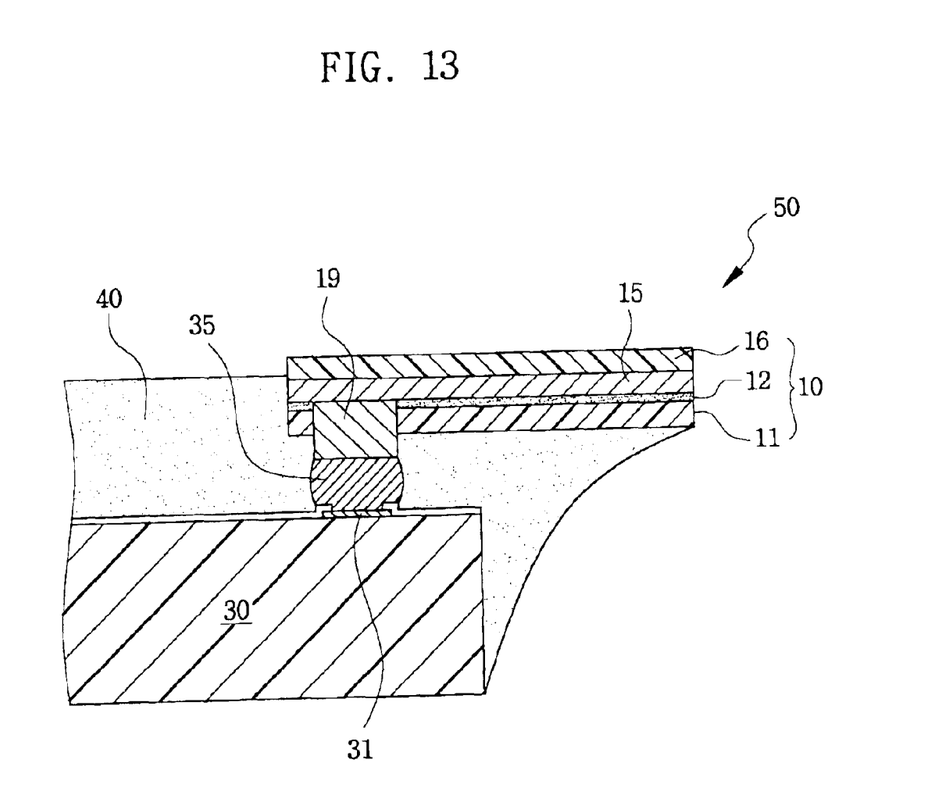
FIG. 13 is a plan view of a tape carrier package in accordance with a preferred embodiment of the present invention.

FIG. 13 is a plan view of a tape carrier package in accordance with one embodiment of the present invention.

Referring to FIG. 13, a tape carrier package 50 employs the above-described tape circuit board 10. That is, the tape circuit board 10 comprises the base film 11 having a first and a second surface, the adhesive layer 12 formed on the first surface of the base film 11, the wiring patterns 15 formed on the adhesive layer 12, the protection layer 16 coating the wiring patterns 15, and the bumps 19 extending above the second surface of the base film 11.

The bumps 19 of the tape wiring board 10 are bonded to chip bumps 35 on electrode pads 31 of semiconductor chip 30. Herein, the semiconductor chip 30 is an edge pad type chip with electrode pads 31 on the edge. The bumps 19 of the tape wiring board 10 and the chip bumps 35 of the semiconductor chip 30 are made of the same material so that the adhesion or bonding force between the bumps 19 and the chip bumps 35 is improved. The bumps 19 of the tape circuit board 10 are bonded to the chip bumps 35 preferably by thermo-compression. The bonding portion between the tape circuit board 10 and the semiconductor chip 30, and the active and the side surfaces of the semiconductor chip 30 are encapsulated with a potting resin or a molding resin, thereby forming a molding portion 40. The back surface of the semiconductor chip 30 is exposed so as to more effectively dissipate heat generated during package operation.

Since the semiconductor chip package of the present invention uses a tape circuit board comprising fine wiring patterns and bumps connected to the wiring patterns, both semiconductor chips with fine pitch chip pads and large-sized semiconductor chips are applicable to this package.

Further, in accordance with the present invention, the semiconductor chip is bonded to the tape circuit board using the bumps formed on the base film of the tape circuit board, thereby preventing problems such as lead deformation and lead damage due to the exposed leads.

Although the preferred embodiments of the present invention have been described in detail hereinabove, it should be understood that many variations and/or modifications of the basic inventive concepts herein taught may appear to those skilled in the art will still fall within the spirit and scope of the present invention as defined in the appended claims.

What is claimed is:

1. A semiconductor chip package comprising:
   a tape circuit board comprising:
      an insulating base film having a first surface and a second surface;
      an adhesive layer formed on said first surface;
      wiring patterns formed on the adhesive layer;
      conductive bumps passing through said base film and said adhesive layer and being connected to said wiring patterns, said bumps extending above the second surface of said base film; and
      a semiconductor chip having a plurality of electrode pads and chip bumps formed on said electrode pads,
   a molding portion for encapsulating a bonding portion between said tape circuit board and said semiconductor chip,
   wherein said chip bumps are bonded to said bumps of said tape circuit board to form a semiconductor package.

2. The semiconductor chip package of claim 1, wherein said bumps of said tape circuit board and said chip bumps of said semiconductor chip are made of the same material.

3. The semiconductor chip package of claim 1, further comprising a protection layer that covers said wiring patterns.

4. The semiconductor chip package of claim 1, wherein said bumps of said tape circuit board extend toward the semiconductor chip.

* * * * *